United States Patent [19]

Ohotoshi et al.

[11] Patent Number: 4,615,479

[45] Date of Patent: Oct. 7, 1986

[54] METHOD FOR SOLDERING AN ELECTRICAL PRODUCT

[75] Inventors: Sachio Ohotoshi; Fumio Hase, both of Yokohama, Japan

[73] Assignees: Asahi Glass Company Ltd., Tokyo; Seimi Chemical Company Ltd., Chigasaki, both of Japan

[21] Appl. No.: 703,613

[22] Filed: Feb. 21, 1985

[51] Int. Cl.$^4$ .............................................. B23K 31/02
[52] U.S. Cl. .................................. 228/180.1; 228/214
[58] Field of Search ...................... 228/180.1, 170, 214

[56] References Cited

U.S. PATENT DOCUMENTS

| | | | |
|---|---|---|---|
| 4,120,843 | 10/1978 | Ameen | 228/180.1 |
| 4,127,692 | 11/1978 | Boynton | 228/170 |
| 4,238,528 | 12/1980 | Angelo | 228/214 |
| 4,283,480 | 8/1981 | Davies | 228/214 |
| 4,373,655 | 2/1983 | McKenzie | 228/180.1 |
| 4,506,443 | 3/1985 | Itoh | 228/180.1 |

*Primary Examiner*—Nicholas P. Godici
*Assistant Examiner*—Kurt Rowan
*Attorney, Agent, or Firm*—Oblon, Fisher, Spivak, McClelland & Maier

[57] ABSTRACT

A method for soldering an electrical product with a soldering flux, wherein an aqueous dispersion or an organic solvent solution of a compound containing a polyfluoroalkyl or polyfluoroether group having from 4 to 21 carbon atoms is applied to a peripheral portion around the soldering portion and dried to form a coating of said compound so as to prevent the soldering flux from penetrating to or depositing on said peripheral portion.

5 Claims, No Drawings

METHOD FOR SOLDERING AN ELECTRICAL PRODUCT

The present invention relates to a method for soldering an electrical product, wherein a coating of a specific fluoro compound is formed along the peripheral portion around the soldering portion to prevent the soldering flux from penetrating to or depositing on said peripheral portion.

For soldering various parts, such as switches, capacitors, connectors or resistors, to a printed circuit board, or an integrated circuit (IC) to an IC socket, it is common to employ flux pretreatment to improve the solderability. Such a flux contains an acidic component or non-conductive component, and if it deposits on a portion other than the soldering portion, it is likely to cause corrosion or conduction failure. Accordingly, it is extremely important to restrict the application of the flux treatment to the necessary portion. There has been proposed to use a masking tape which is designed to protect a non-soldering portion and to be pealed off after the soldering operation. However, this is a major factor which prevents the automation of the soldering treatment. In the case of a printed circuit board, soldering is frequently applied to through-holes, and the flux is likely to penetrate to the interior of the electrical product through such through-holes. Therefore, it is required not only to prevent the deposition of the flux but also to prevent the penetration of the flux.

Accordingly, it is an object of the present invention to provide a method for soldering an electrical product, whereby the soldering flux is prevented from penetrating to or depositing on the peripheral portion around the soldering portion.

Namely, the present invention provides a method for soldering an electrical product with a soldering flux, wherein an aqueous dispersion or an organic solvent solution of a compound containing a polyfluoroalkyl or polyfluoroether group having from 4 to 21 carbon atoms is applied to a peripheral portion around the soldering portion and dried to form a coating of said compound so as to prevent the soldering flux from penetrating to or depositing on said peripheral portion.

Now, the present invention will be described in detail with reference to the preferred embodiments.

As the compound containing a polyfluoroalkyl or polyfluoroether group having from 4 to 21 carbon atoms (hereinafter referred to simply as "$R_f$ group"), there may be mentioned a compound represented by the following formula I (hereinafter referred to as a "compound I"), a homopolymer of an unsaturated ester containing a $R_f$ group, or a copolymer of unsaturated esters containing different $R_f$ groups (hereinafter referred to as a "compound II"), or a copolymer of an unsaturated ester containing a $R_f$ group with other copolymerizable compound (hereinafter referred to as a "compound III").

$$[R_f A(X)_n]_m Z \qquad (I)$$

In the above formula I, $R_f$ is a straight chain or branched polyfluoroalkyl group having from 4 to 21 carbon atoms or an aliphatic, aromatic or cyclic polyfluoroether group having from 4 to 21 carbon atoms. The compound may contain a hydrogen atom or a chlorine atom at its terminal. However, $R_f$ is preferably a straight chain perfluoroalkyl group or an aliphatic perfluoropolyether group. A is CO, SO$_2$, COO, or —CH$_2$—$_p$ or —CH$_2$—$_p$O where p is from 0 to 10. X is NR$^1$C$_2$H$_4$O, N(C$_2$H$_4$O)$_2$, $+CH_2-CH+$, COO, NR$^1$(CH$_2$)$_q$NR$^2$C$_2$H$_4$O,

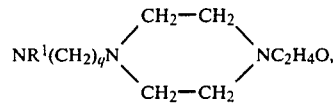

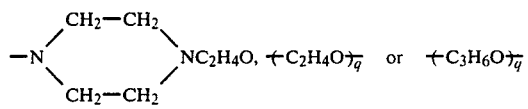

where q is from 1 to 10, and each of R$^1$ and R$^2$ is a hydrogen atom, an alkyl group or an aryl group. n is 0 or 1. When n=0, X does not exist. m is from 1 to 4, and Z is a 1 to 4 valent organic group depending upon m. Z may be NR$^1$(C$_2$H$_4$N)$_q$R$^1$, NR$^1$(C$_3$H$_6$N)$_q$R$^1$, H, SH, P(O)(OH)$_n$, CONH(CH$_2$)$_q$NHCO,

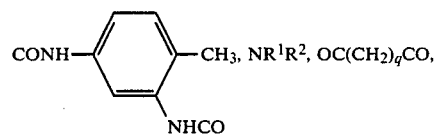

NCO(CH$_2$)$_q$NCONH(CH$_2$)$_q$NCO, or
  |
  CONH(CH$_2$)$_q$NCO

NCO(CH$_2$)$_q$NCONH(CH$_2$)$_q$NCO
  |
  CONH(CH$_2$)$_q$N—CONH(CH$_2$)$_q$NCO
  |
  CONH(CH$_2$)$_q$NCO where q=1-10, n=0 or 1, and each of R$^1$ and R$^2$ is a hydrogen atom, an alkyl group or an aryl group. There is no particular restriction to the unsaturated ester containing a polyfluoroalkyl or polyfluoroether group having from 4 to 21 carbon atoms for forming the compound II or III. However, the following acrylates or methacrylates are preferred.

CF$_3$(CF$_2$)$_4$CH$_2$OCOC(CH$_3$)=CH$_2$
CF$_3$(CF$_2$)$_6$(CH$_2$)$_2$OCOC(CH$_3$)=CH$_2$
CF$_3$(CF$_2$)$_6$COOCH=CH$_2$
CF$_3$(CF$_2$)$_7$CH$_2$CH$_2$OCOCH=CH$_2$

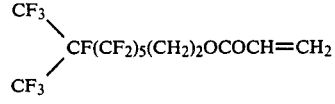

CF$_3$(CF$_2$)$_7$SO$_2$N(C$_3$H$_7$)(CH$_2$)$_2$OCOCH=CH$_2$
CF$_3$(CF$_2$)$_7$(CH$_2$)$_4$OCOCH=CH$_2$
CF$_3$(CF$_2$)$_7$SO$_2$N(CH$_3$)(CH$_2$)$_2$OCOC(CH$_3$)=CH$_2$
CF$_3$(CF$_2$)$_7$SO$_2$N(C$_2$H$_5$)(CH$_2$)$_2$OCOCH=CH$_2$
CF$_3$(CF$_2$)$_7$CONH(CH$_2$)$_2$OCOCH=CH$_2$

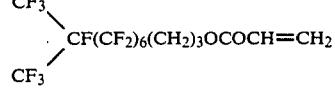

-continued

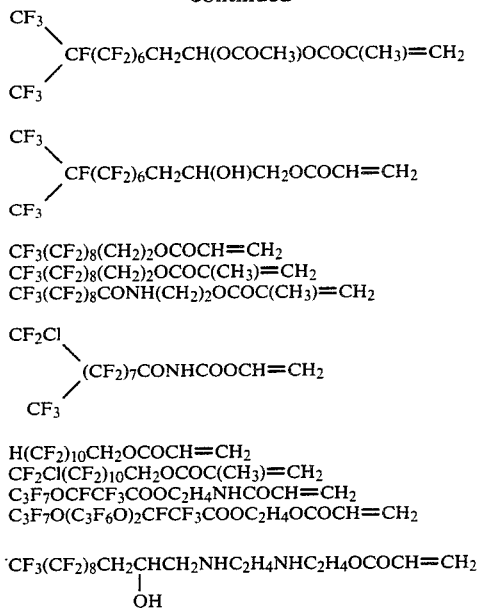

CF₃(CF₂)₈(CH₂)₂OCOCH=CH₂
CF₃(CF₂)₈(CH₂)₂OCOC(CH₃)=CH₂
CF₃(CF₂)₈CONH(CH₂)₂OCOC(CH₃)=CH₂

$$\underset{CF_3}{\underset{|}{CF_2Cl}}\diagdown(CF_2)_7CONHCOOCH=CH_2$$

H(CF₂)₁₀CH₂OCOCH=CH₂
CF₂Cl(CF₂)₁₀CH₂OCOC(CH₃)=CH₂
C₃F₇OCFCF₃COOC₂H₄NHCOCH=CH₂
C₃F₇O(C₃F₆O)₂CFCF₃COOC₂H₄OCOCH=CH₂

CF₃(CF₂)₈CH₂CHCH₂NHC₂H₄NHC₂H₄OCOCH=CH₂
           |
           OH

The compound II may be an epoxy compound such as

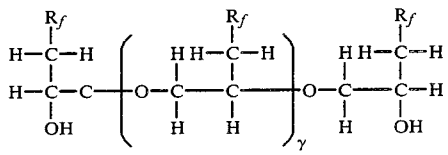

where γ is from 0 to 100.

The compound copolymerizable with the above unsaturated ester may be selected from a wide range of compounds so long as it does not adversely affect the method of the present invention. For instance, it is possible to copolymerize, as a constituting unit in the copolymer, one or more polymerizable compounds containing no perfluoroalkyl group, such as ethylene, vinyl acetate, vinyl chloride, vinyl fluoride, vinylidene halide, styrene, α-methylstyrene, p-methylstryene, acrylic acid and its alkyl ester, methacrylic acid and its alkyl ester, poly(oxyalkylene)acrylate, poly(oxyalkylene)methyacrylate, acrylamide, methacrylamide, diacetoneacrylamide, methyloldiacetone acrylamide, N-methylol acrylamide, vinyl alkyl ether, halogenated alkyl vinyl ether, vinyl alkyl ketone, butadiene, isoprene, chloroprene, glycidyl acrylate, benzyl methacrylate, benzyl acrylate, cyclohexyl acrylate, maleic anhydride, aziridinyl acrylate or methacrylate, and N-vinyl carbazole. The ratio for the copolymerization of such a copolymerizable component to the unsaturated ester containing the polyfluoroalkyl or polyfluoropolyether group is usually from 1 to 70% by weight, preferably from 10 to 50% by weight.

To obtain the compound II or III of the present invention, it is common to employ a solution polymerization wherein the starting material polymerizable compounds are dissolved in a proper organic solvent, and the polymerization is conducted by the action of the polymerization initiating source (e.g. a peroxide or an azo compound soluble in the organic solvent used, or an ionizing radiation). As a solvent suitable for the solution polymerization, there may be mentioned toluene, ethyl acetate, isopropyl alcohol, 1,1,2-trichloro-1,2,2-trifluoroethane, tetrachlorodifluoroethane or methylchloroform.

In the present invention, the above-mentioned compounds I, II and III may be employed alone or in combination as a mixture of two or more different kinds. In the case of a mixture of the compounds I, II and III, it is preferred to use the compound II as the major component, since the performance for the prevention of the penetration or deposition of the flux is thereby high. The fluorine content in the compound I, II or III is preferably at least 20% by weight, more preferably at least 50% by weight.

These compounds are dispersed in water or dispersed or dissolved in an organic solvent, and such an aqueous dispersion or organic solution is applied by spraying or brushing to the non-soldering surface, particularly to the portion where the flux is likely to penetrate to or deposit on. Otherwise, the treatment may be made by dipping the non-soldering surface in such a dispersion or solution. As the organic solvent, there may be mentioned a ketone such as acetone or methyl ethyl ketone, an ester such as methyl acetate, ethyl acetate or isoamyl acetate, an ether such as diethyl ether or dioxane, or a halogenated hydrocarbon such as methyl chloroform, trichloroethylene, tetrachloroethylene, tetrachlorodifluoroethane, 1,1,2-trichloro-1,2,2-trifluoroethane or methaxylene hexafluoride. These solvents may be used alone or in combination as a mixture of two or more different kinds. A spary composition may be prepared by adding a propellant such as dichlorodifluoromethane, monofluorotrichloromethane or dichlorotetrafluoroethane to the above solution and the mixture is filled in a proper container. It is advantageous to conduct spray treatment in that after the treatment, the composition immediately dries up and exhibits excellent prevention of the penetration or deposition of the flux. The amount of the compound I, II or III in the solvent or water is usually from 0.01 to 10% by weight, preferably from 0.1 to 2% by weight.

If the compound I, II or III is applied to the through-holes in a printed circuit board to form a coating of the compound, the flux will be prevented from penetrating via the through-holes to the side of the printed circuit board on which parts are to be mounted, whereby corrosion can be prevented. Further, when the soldering is applied to the terminals or lead wires from such parts as switches, capacitors, connectors or resistors, it is likely that the flux penetrates via the terminals or lead wires to the interior of such parts. Accordingly, when the flux contains a non-conductive component, a failure in the electric conduction is likely to be led in the interior of the parts. It is possible to prevent the penetration of the flux by forming the coating of the present invention at the peripheral portion around the soldering portion, e.g. in the vicinity of the base portion from which the terminals or lead wires extend.

On the other hand, if the amount of the compound I, II or III in the organic solvent or water is adjusted to be as small as at most about 0.2% by weight and a thin coating is thereby formed, such a thin coating does not interfere with the soldering operation even if the coating is formed on the soldering portion. Thus, depending upon the thickness of the coating, the coating may be formed on the entire surface of the electrical product, i.e. not only on the non-soldering surface at the peripheral portion around the soldering portion, but also on the soldering portion, whereby the efficiency for the flux treatment may be improved. The formed coating brings about no adverse electrical effect, and may be retained as coated. However, it may readily be dissolved and removed with frons such as 1,1,2-trichloro-1,2,2-trifluoroethane which give no adverse effect to the material of the electrical product. The coating of the compound I, II or III has a function whereby the flux deposited on the coating can readily be removed without using any solvent, in addition to the above-mentioned function for preventing the penetration of the flux.

Now, the present invention will be described with reference to Examples. However, it should be understood that the present invention is by no means restricted by these specific Examples.

EXAMPLES

Each fluoro compound as identified in Table 1 was dissolved in 1,1,2-trifluoro-1,2,2-trichloroethane to obtain a 1 wt.% solution. This solution was coated to the through-holes of a printed circuit board and dried at room temperature to form a coating of the fluoro compound. A soldering flux was put in a container to a depth of about 2 mm, and the printed circuit board was placed thereon so that the soldering surface side of the printed circuit board was located below and the parts-mounting surface side was located above, and left for one minute. One minute later, the penetration of the flux via the through-holes to the parts-mounting surface side was determined by the observation with naked eyes. The results are shown in Table 1.

Likewise, the above solution was coated to the base portion of a terminal extending outwardly from a switch, the base portion being in contact with the switch main body. The coated solution was dried at room temperature to form a coating of the fluoro compound. A soldering flux was coated to the forward end of the terminal to be soldered other than the base portion of the terminal on which the coating was formed. The penetration of the flux via the terminal to the interior of the switch was determined by the observation with naked eyes. The results are shown in Table 1.

TABLE 1

|  | Fluoro compound | Prevention of the penetration of flux Via through-holes | Via a terminal of a switch |
| --- | --- | --- | --- |
| Example | Homopolymer of $C_8F_{17}C_2H_4OCOCH=CH_2$ | Good | Good |
|  | Copolymer of $C_8F_{17}C_2H_4OCOC(CH_3)=CH_2/CH_2=CCl_2 = 90/10$ | " | " |
|  | Copolymer of $C_{10}F_{21}CONHC_2H_4OCOCH=CH_2/CH_2=CH(COOC_{12}H_{25}) = 80/20$ | " | " |
|  | Copolymer of $C_6F_{13}SO_2NHC_2H_4OCOCH=CH_2/C_3F_7O(C_3F_6O)_2CFCF_3COOC_2H_4OCOCH=CH_2 = 70/30$ | " | " |
|  | $C_8F_{17}CONHC_2H_4NHCOC_8F_{17}$ | " | " |
|  | $(C_{10}F_{21}C_2H_4O)_3P=O$ | " | " |
|  | $C_6F_{13}C_2H_4OOCNH(CH_2)_3NCONH(CH_2)_3NHCOOC_2H_4C_6F_{13}$ with branch $CONH(CH_2)_3NHCOOC_2H_4C_6F_{13}$ | " | " |
|  | (structural formula with $C_8F_{17}$ groups, -OH terminals, and repeating unit subscript 4) | " | " |
| Comparative Example | No treatment | Bad | Bad |

Evaluation standards:
Good: No flux penetrated
Bad: Penetration fo the flux was observed.

We claim:

1. A method for soldering an electrical product with a soldering flux, wherein an aqueous dispersion or an organic solvent solution of an active compound consisting essentially of a polyfluoroalkyl or polyfluoroether group having from 4 to 21 carbon atoms is applied to a peripheral portion around the soldering portion and dried to form a coating of said compound so as to prevent the soldering flux from penetrating to or depositing on said peripheral portion.

2. The method according to claim 1, wherein the compound consisting essentially of a polyfluoroalkyl or polyfluoroether group having from 4 to 21 carbon atoms is a homopolymer of an acrylate or methacrylate containing a perfluoroalkyl or aliphatic perfluoropolyether group having from 4 to 21 carbon atoms, or a copolymer of the acrylate or methacrylate with other copolymerizable compound.

3. The method according to claim 1, wherein the electrical product is a printed circuit board, an integrated circuit or a switch, capacitor, connector or resistor connected thereto.

4. The method according to claim 1, wherein the coating of the compound consisting essentially of a polyfluoroalkyl or polyfluoroether group having from 4 to 21 carbon atoms is formed on through-holes of a printed circuit so as to prevent the soldering flux from penetrating to the peripheral portion other than the soldering portion.

5. An electrical product prepared by the method according to claim 1.

* * * * *